(12) United States Patent
Mishima et al.

(10) Patent No.: US 7,301,224 B2
(45) Date of Patent: Nov. 27, 2007

(54) SURFACE ACOUSTIC WAVE DEVICE AND MANUFACTURING METHOD OF THE SAME

(75) Inventors: Naoyuki Mishima, Yokohama (JP); Takumi Kooriike, Suzaka (JP)

(73) Assignee: Fujitsu Media Devices Limited, Yokohama (JP)

( * ) Notice: Subject to any disclaimer, the term of this patent is extended or adjusted under 35 U.S.C. 154(b) by 3 days.

(21) Appl. No.: 11/212,914

(22) Filed: Aug. 29, 2005

(65) Prior Publication Data

US 2006/0049489 A1    Mar. 9, 2006

(30) Foreign Application Priority Data

Aug. 30, 2004    (JP)    ............... 2004-251103

(51) Int. Cl.
*H01L 23/552*    (2006.01)
*H01L 23/053*    (2006.01)

(52) U.S. Cl. ............... 257/659; 257/704; 257/729; 257/E23.114; 257/E23.188; 257/E23.192

(58) Field of Classification Search ............... 257/659, 257/704, 729, E23.114, E23.188, E23.192
See application file for complete search history.

(56) References Cited

U.S. PATENT DOCUMENTS

| 5,438,305 A | * | 8/1995 | Hikita et al. ............... 333/32 |
|---|---|---|---|
| 5,459,368 A | * | 10/1995 | Onishi et al. ............... 310/313 R |
| 6,281,436 B1 | * | 8/2001 | Gotoh et al. ............... 174/538 |
| 6,518,501 B1 | * | 2/2003 | Kawahara et al. ............... 174/538 |
| 6,734,605 B2 | * | 5/2004 | Kinoshita ............... 310/348 |
| 2002/0023765 A1 | * | 2/2002 | Sugiura et al. ............... 174/52.2 |
| 2002/0043899 A1 | | 4/2002 | Kishimoto |
| 2002/0190266 A1 | * | 12/2002 | Kanatake ............... 257/112 |
| 2003/0112986 A1 | * | 6/2003 | Furukawa ............... 381/190 |

FOREIGN PATENT DOCUMENTS

| EP | 1 096 566 A2 | 5/2001 |
|---|---|---|
| JP | 59-10015 A | 1/1984 |
| JP | 61-102757 A | 5/1986 |
| JP | 4-179255 A | 6/1992 |
| JP | 2000-4139 A | 1/2000 |
| JP | 2001-110946 A | 4/2001 |

* cited by examiner

*Primary Examiner*—Evan Pert
*Assistant Examiner*—Victor A. Mandala, Jr.
(74) *Attorney, Agent, or Firm*—Arent Fox LLP

(57) ABSTRACT

A surface acoustic wave device has a SAW device element 10 and a package 20 housing the SAW device element. The package includes a resin substrate 20 having metal patterns 21 and 22 formed on both surfaces thereof, and a resin cap 32. The SAW device element is mounted on one of the metal patterns of the resin substrate. The resin cap is adhered to the resin substrate to cover the SAW device element. The surfaces of the resin substrate are flush with corresponding end surfaces of the resin cap.

10 Claims, 14 Drawing Sheets

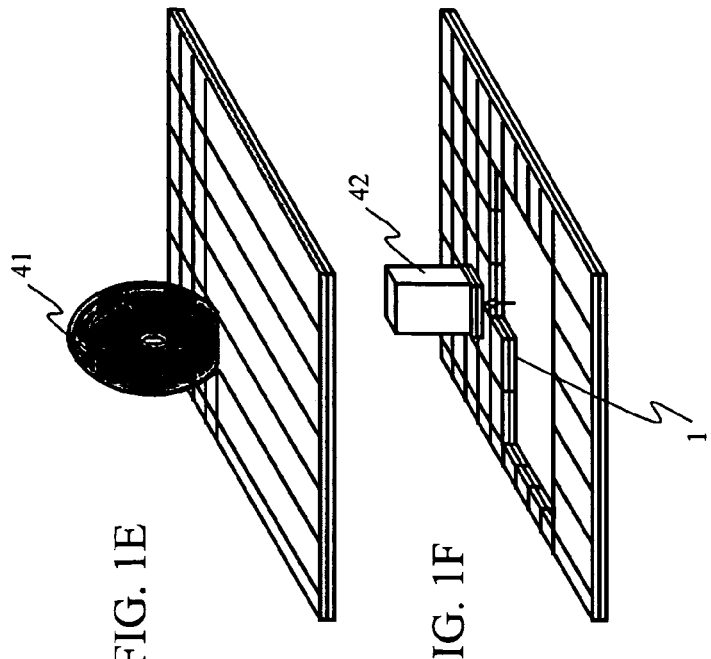
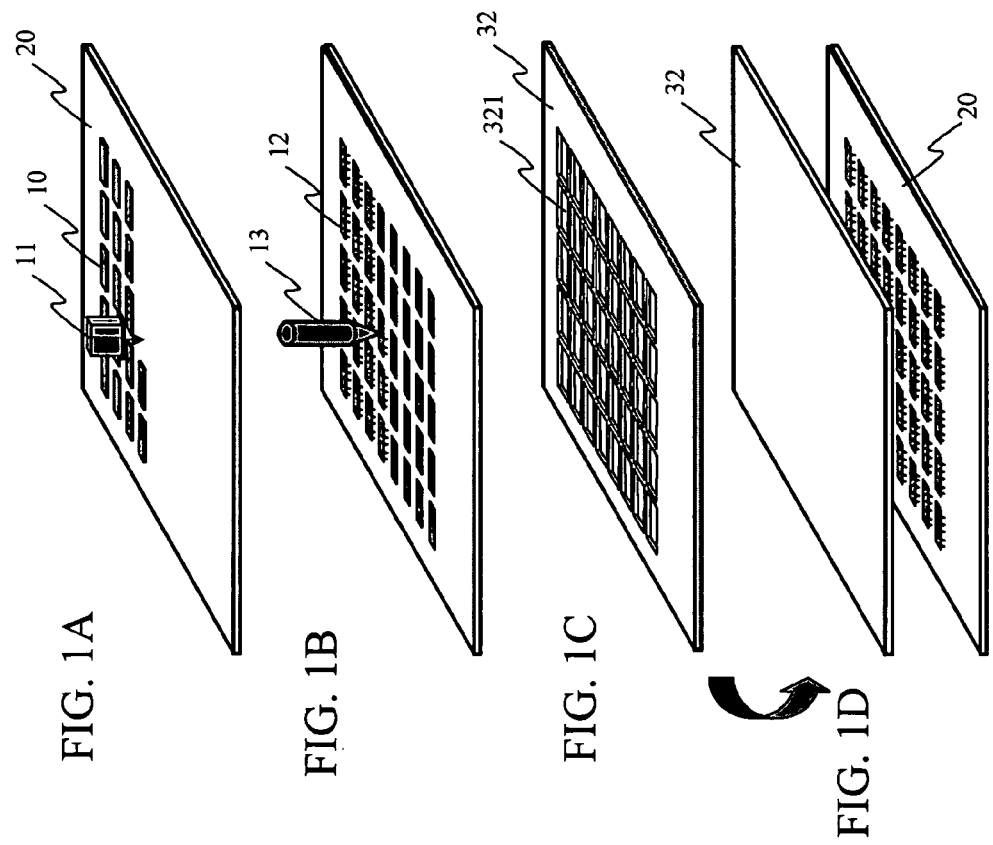

SECTIONAL CONFIGURATION OF PASS-THROUGH WIRING FILLED WITH RESIN

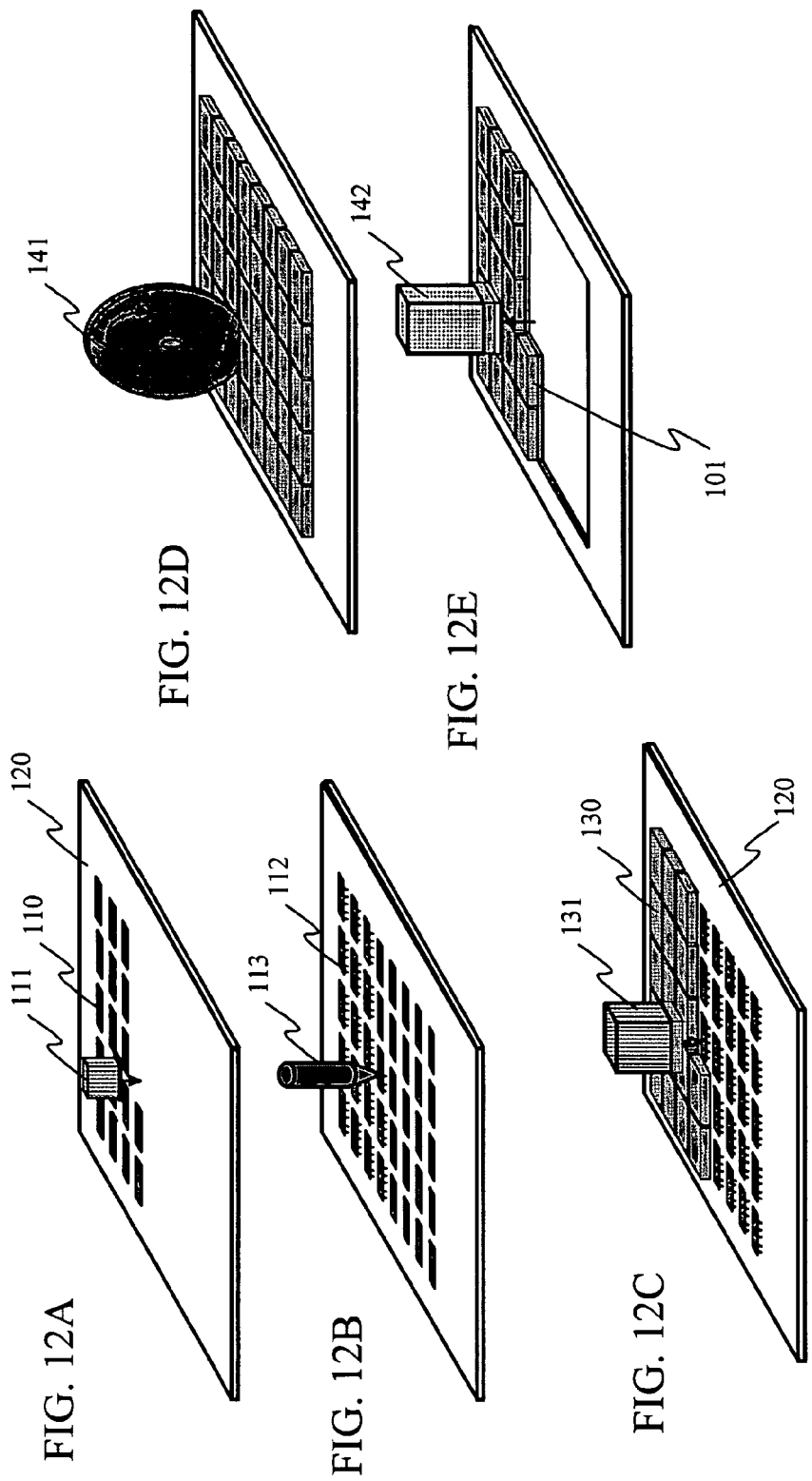

SURFACE ACOUSTIC WAVE DEVICE AND MANUFACTURING METHOD OF THE SAME

BACKGROUND OF THE INVENTION

1. Field of the Invention

This invention generally relates to surface acoustic wave devices that may be used for a television (simply referred to as TV, hereinafter), a video tape recorder (simply referred to as VTR, hereinafter), a DVD (Digital Versatile Disk) recorder, and a filter element and an oscillator or the like of a portable phone or the like, and a method for manufacturing thereof.

2. Description of the Related Art

A surface acoustic wave device (simply referred to as SAW device, hereinafter) is widely used for various circuits that process radio signals in the frequency range of 45 MHz to 2 GHz. Examples of those circuits are a bandpass filter for transmission, a bandpass filter for reception, a resonator for local oscillator, an antenna duplexer, an intermediate frequency filter and an FM modulator.

The signal processing devices are now miniaturized, and there is an increasing demand for downsizing of electronic components such as SAW devices. In particular, portable electronic devices such as portable phones require surface-mounting, height-lowered SAW devices.

Recently, there has been a proposal for fabricating SAW devices of surface mounting type. This proposal may be applied to other types of electronic components. The proposed method employs a sheet-like package substrate, on which electronic elements like SAW device chips are mounted in an array of rows and columns at intervals. The electronic elements are electrically connected to the package substrate and are then sealed with caps. Finally, the package substrate is cut and divided into individual electronic components.

Japanese Patent Application Publication No. 59-010015 (hereinafter referred to as Document 1) discloses a method of fabricating piezoelectric devices. In this method, piezoelectric vibrator elements are arranged in rows and columns at intervals on a ceramic substrate having a sheet shape. Caps are adhered to the ceramic substrate so as to cover the piezoelectric vibrator elements. Then, the ceramic substrate is cut along laser slits provided on the ceramic substrate, and is divided into individual piezoelectric vibrators.

The ceramic caps separately cover the piezoelectric vibrator elements. The ceramic caps are coated with adhesive like epoxy and are adhered to the piezoelectric vibrator elements on the ceramic substrate, so that the element can be hermetically sealed.

However, adjacent caps pull each other or the vibrator element and the cap pull each other due to the surface tension of the adhesive agent until the hardening of the adhesive is completed after the caps are mounted on the ceramic substrate. Thus, the caps may be displaced. The displacement of caps may cause a difficulty in cutting the ceramic substrate and may result in piezoelectric vibrators having an uneven outer shape. The above problem will now be described in more detail by referring to a manufacturing process of a conventional SAW device.

FIGS. 12A through 12E illustrate a manufacturing process of a conventional SAW device. As shown in FIG. 12A, SAW device elements 110 are mounted, in an array of rows and columns at intervals, on a resin substrate 120 having metal patterns formed on both surfaces thereof by an element transfer tool 111.

Next, as shown in FIG. 12B, the SAW device elements 110 and the resin substrate 120 are connected to each other through metal wires 112 by a bonding capillary 113.

Then, as shown in FIG. 12C, resin caps 130 are mounted on the resin substrate 120 so as to cover the SAW device elements 110, and are then adhered to the resin substrate 120 through an adhesive.

Thereafter, as shown in FIG. 12D, the resin substrate 120 is cut along spaces between the resin caps 130 by a dicing blade 141. Then, as shown in FIG. 12E, SAW devices 101 are picked up one by one by a transfer tool 142.

FIGS. 13A and 13B illustrate a displacement of the resin cap 130 caused by the surface tension of the adhesive agent. As shown in FIG. 13A, the resin caps 130 are adhered to the resin substrate 120 through an adhesive 131. In this case, the surface tension of the adhesive 131 displaces the resin cap 130 along an arrow X, when the adjacent adhesive 131 connect to each other. Thus, the resin cap 130 deviates from the mounted position.

In addition, as shown in FIG. 13B, the adhesive 131 sometimes flows into the resin cap 130 and is in touch with the SAW device element 110. In this case, the resin cap 130 is horizontally pulled toward the SAW device element 110 along an arrow Y caused by the surface tension of the adhesive 131. Thus, the resin cap 130 deviates from the mounted position.

FIGS. 14A and 14B illustrate a cutting surface of the SAW device 101. More specifically, FIG. 14A is a cross-sectional view of SAW devices 101 before cutting, and FIG. 14B is a cross-sectional view of SAW devices 101 after cutting.

As shown in FIG. 14B, the adhesive 131 and the resin substrate 120 having metal patterns 121 and 122 formed on both surfaces thereof have a common cutting face after being cut by the dicing blade. In this case, the adhesive 131 and the end parts of the resin substrate 120 located outside of the resin cap 130 are unused areas formed on the side of the SAW device 101 caused by the method of manufacturing above. The unused areas make it difficult to miniaturize the SAW device 101. In addition, the SAW devices 101 after cutting may have unused areas different in size and shape caused by the displacement of the resin cap 130 and so on. Therefore, the conventional SAW devices have unstable outer shapes.

SUMMARY OF THE INVENTION

The present invention has an object to provide a surface acoustic wave device having a small and stabilized outer shape without the problem caused by the adhesion of the cap.

According to an aspect of the present invention, there is provided a surface acoustic wave device including a surface acoustic wave (SAW) device element and a package housing the surface acoustic wave device element. The package includes a resin substrate having metal patterns formed on both surfaces thereof, and a resin cap. The SAW device element is mounted on one of the metal patterns of the resin substrate. The resin cap is adhered to the resin substrate to cover the surface acoustic wave device element. End surfaces of the resin substrate are flush with corresponding end surfaces of the resin cap. With the above-mentioned configuration, it is possible to provide a surface acoustic wave device having a small and stabilized outline shape.

According to another aspect of the present invention, there is provided a manufacturing method of a surface acoustic wave device including the steps of adhering a first resin substrate having metal patterns on both surfaces thereof and having SAW device elements mounted on one of the metal patterns in an array of rows and columns at intervals, and a second resin substrate having hollows formed in an array of rows and columns at the same intervals as those of the first substrate so as to cover the SAW device element face to face each other by an adhesive so that the SAW device element is covered with the divot, and cutting the first resin substrate and the second resin substrate simultaneously into devices, each of which has one SAW device element.

In accordance with the present invention, all surface acoustic wave device elements can be covered with the resin cap at a time, when the second resin substrate having hollows is only overlapped with the first resin substrate equipped with the SAW device elements. And a step of adhering each resin cap to each resin substrate of SAW device individually is omitted. Therefore, the manufacturing process of the surface acoustic wave device can be simplified. In addition, the adhesive is coated between the resin substrate and the resin cap simultaneously. Therefore, a problem of moving of the resin cap does not occur.

According to yet another aspect of the present invention, there is provided a manufacturing method of a surface acoustic wave device including the steps of adhering a resin substrate having metal patterns on both faces thereof, having SAW device elements mounted on one of the metal patterns in an array of rows and columns at intervals and having a resin frame surrounding the SAW device element individually, and a resin lid covering the SAW device element through the resin frame, and cutting the resin substrate and the resin lid simultaneously into devices, each of which has one SAW device element.

In accordance with the present invention, all surface acoustic wave device elements can be covered with the resin frame and the resin lid at a time, when the resin substrate equipped with the SAW device elements, the resin frame and the resin lid are only overlapped. And a step of adhering each resin cap to each resin substrate of each SAW device individually is omitted. Therefore, the manufacturing process of the surface acoustic wave device can be simplified. In addition, an adhesive is coated simultaneously between the resin frame and the resin lid. Therefore, the resin caps cannot be moved.

BRIEF DESCRIPTION OF THE DRAWINGS

Preferred embodiments of the present invention will be described in detail with reference to the following drawings, wherein:

FIGS. 1A through 1F illustrate a manufacturing method of a SAW device in accordance with a first embodiment of the present invention;

FIGS. 12A through 12E illustrate a manufacturing process of a conventional SAW device;

DESCRIPTION OF THE PREFERRED EMBODIMENTS

First Embodiment

Figure 2A:
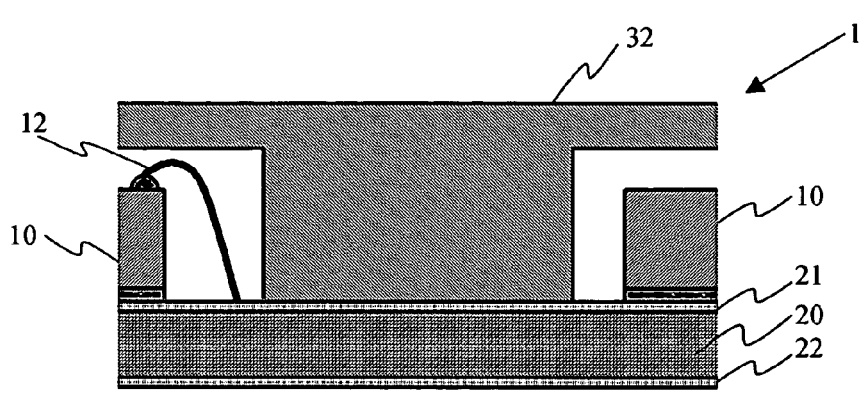
FIGS. 2A and 2B are cross-sectional views of a SAW device.

FIGS. 1A through 1F illustrate a manufacturing method of a SAW device in accordance with a first embodiment of the present invention. As shown in FIG. 1A, SAW device elements 10, which may be chips, are mounted by an element transfer tool 11 in an array of rows and columns at intervals on an upper surface of a resin substrate 20 having metal patterns formed on both surfaces thereof. Each of the SAW device elements 10 has a piezoelectric substrate formed of, for example, LN (lithium niobate) or LT (lithium tantalate), and comb-like electrodes formed on one of the main surfaces of the piezoelectric substrate. The SAW device elements 10 may be of any type, and may be a transversal filter, a ladder filter or a multimode filter.

Next, the SAW device elements 10 and the metal patterns of the resin substrate 20 are connected through metal wires 12 by a bonding capillary 13, as shown in FIG. 1B.

FIG. 1C illustrates a sheet cap 32. The sheet cap 32 corresponds to the second resin substrate in SUMMARY OF THE INVENTION. As shown in FIG. 1C, hollows 321 are formed on the sheet cap 32. The hollows 321 are formed on a lower surface of the sheet cap 32 and are arranged in an array of rows and columns at intervals so that each of the hollows 321 covers one SAW device element 10 and is not in contact with the SAW device element 10 when the upper surface of the resin substrate 20 and the lower surface of the sheet cap 32 are overlapped. The lower surface of the sheet cap 32 is upper in FIG. 1C because the substrate 20 is turned upside down in FIG. 1D.

Then, the upper surface of the resin substrate 20 and the lower surface of the sheet cap 32 are overlapped each other, are adhered by adhesive, and are sealed with pressure and heat, as shown in FIG. 1D.

Subsequently, the resin substrate 20 and the sheet cap 32 are cut into SAW devices 1 by a dicing blade 41, each of which has one SAW device element 10, as shown in FIG. 1E.

Then, the SAW devices 1 are separated out of the resin substrate 20 and the sheet cap 32 by a transfer tool 42, and are completed. In this case, each of the SAW device elements 10 is covered with the sheet cap 32 by simply overlapping the resin substrate 20 with the sheet cap 32. It is thus possible to omit a step of adhering each resin cap to a resin substrate individually. Therefore, the manufacturing process of the SAW device can be simplified. In addition, the adhesive is wholly coated between the sheet cap 32 and the resin substrate 20 simultaneously. Therefore, a problem about displacement of the resin cap does not occur.

Figure 2B:
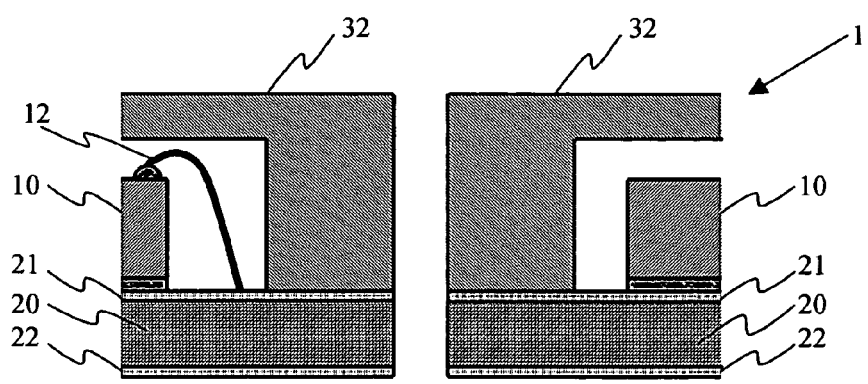

FIGS. 2A and 2B are partial cross-sectional views of two adjacent SAW devices 1. More specifically, FIG. 2A illustrates a cross-sectional view of the SAW device 1 before cutting, and FIG. 2B illustrates a cross-sectional view of the SAW device 1 after cutting by the dicing blade 41.

As shown in FIG. 2B, the resin substrate 20 and the sheet cap 32 are cut simultaneously by the dicing blade 41. One end surface of the resin substrate 20 and one end surface of the sheet cap 32 (the sheet cap 32 after cutting is also called a resin cap 32) are on a same plane, and are flush with each other. The resin substrate 20 and the resin cap 32 form the package of the SAW device 1. The package formed by this process has no adhesive and no end part of the resin substrate 20 outside of the sheet cap 32, unlike the conventional SAW device. It is thus possible to provide a SAW device having a small and stabilized outer shape. The end surface of the resin substrate 20 and the end surface of the sheet cap 32 correspond to the end surfaces in SUMMARY OF THE INVENTION.

Figure 3:
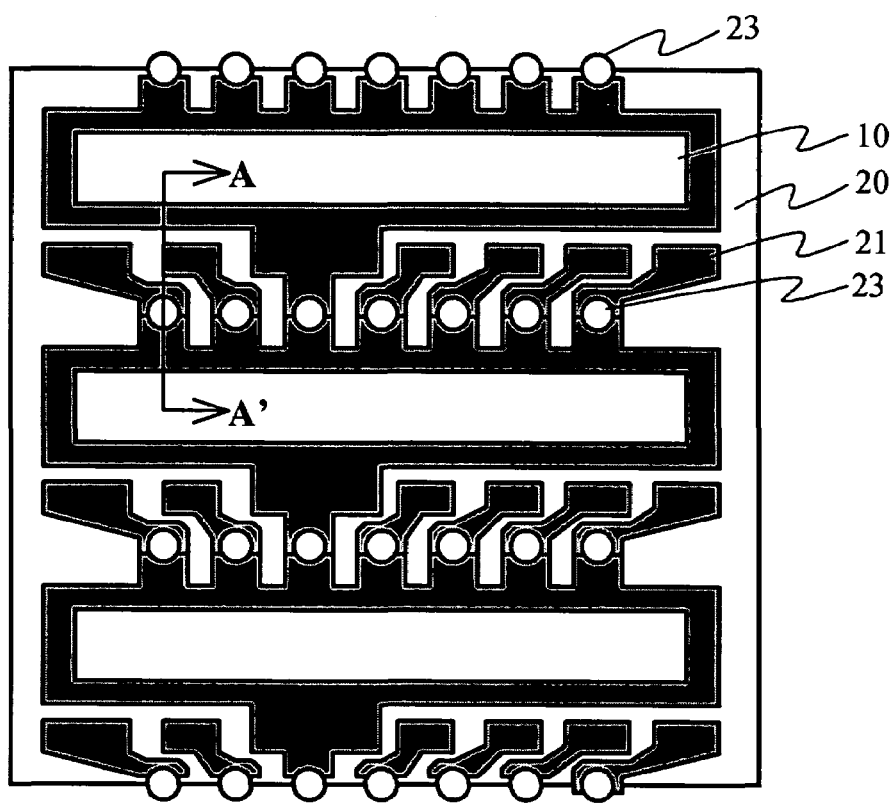
FIG. 3 illustrates a top view of an example of a resin substrate.

FIG. 3 illustrates a top view of an example of the resin substrate 20. As is shown in FIG. 3, an obverse-side metal pattern 21 is formed on the upper surface of the resin substrate 20, and a reverse-side metal pattern 22 is formed on the lower surface of the resin substrate 20 (not shown in FIG. 3). The SAW device element 10 is mounted on the obverse-side metal pattern 21.

The obverse-side metal pattern 21 is connected to the reverse-side metal pattern 22 through contact through holes 23. The contact through hole 23 is formed of a through hole having a metallized inner surface thereof, as shown in FIG. 3 and FIG. 4. The contact through holes 23 are arranged in line on a cutting line of the dicing blade 41. Each of the pass-through wirings 23 is therefore divided into two parts in the longitudinal direction thereof by the dicing blade 41.

As has been described with reference to FIG. 1, the sheet cap 32 is adhered on the resin substrate 20 by adhesive. In this case, the adhesive possibly flows to the lower surface of the resin substrate 20 through the contact through hole 23. In particular, if the viscosity of the adhesive agent before hardening is small, the adhesive easily runs to the reverse-side metal pattern 22. The reverse-side metal pattern 22 is used for an external terminal of the SAW device 1, and is used to make a connection, through a metal like a solder, with a printed circuit board on which components are mounted. When the adhesive runs to the reverse-side metal pattern 22, the solder is not fusion-bonded, and an electrical connection of the reverse-side metal pattern 22 as an external terminal is damaged. In the SAW device in accordance with the present invention, the contact through hole 23 is improved in many points. A description will be given below.

Figure 4A:
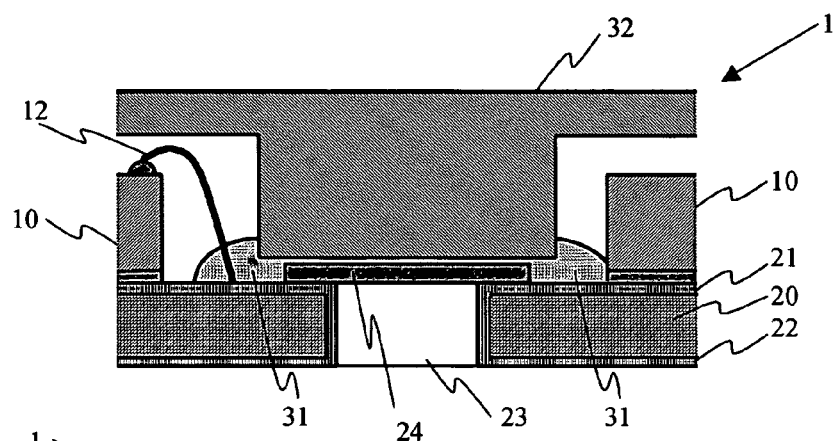
FIGS. 4A and 4B are cross-sectional views taken along a line A-A' in FIG. 3.
Figure 4B:
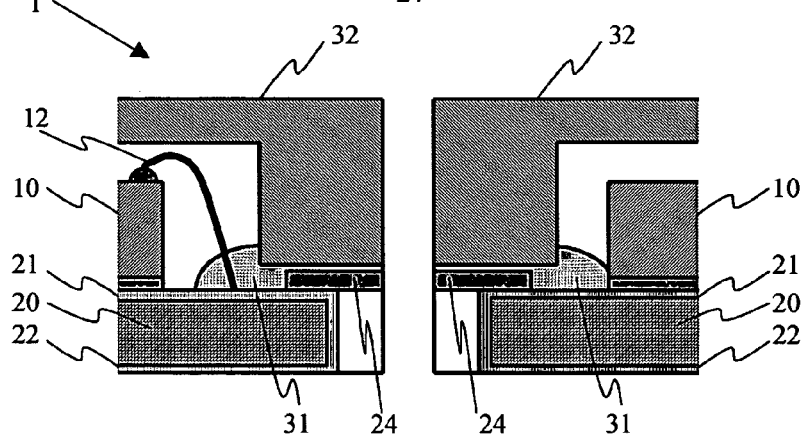

FIGS. 4A and 4B illustrate cross-sectional views taken along a line A-A' in FIG. 3. More specifically, FIG. 4A is a cross-sectional view of the SAW device 1 before cutting, and FIG. 4B is a cross-sectional view of the SAW device 1 after cutting by the dicing blade 41.

Referring to FIG. 4A, a resin film 24 is attached to the resin substrate 20 so as to cover the contact through hole 23. A photosensitive resin or the like, for example, can be used for the resin film 24. It is possible to form the resin film 24 by patterning using exposure and development.

In this case, an adhesive 31 that adhere the resin substrate 20 and the sheet cap 32 never flows into the contact through hole 23. It is therefore possible to prevent the function of the reverse-side metal wiring 22 as an external terminal from being damaged.

In addition, as shown in FIG. 4B, there is no adhesive outside of the resin cap 32 that is the divided sheet cap 32, unlike the conventional SAW device. It is thus possible to provide a SAW device having a small and stabilized shape.

Figure 5A:
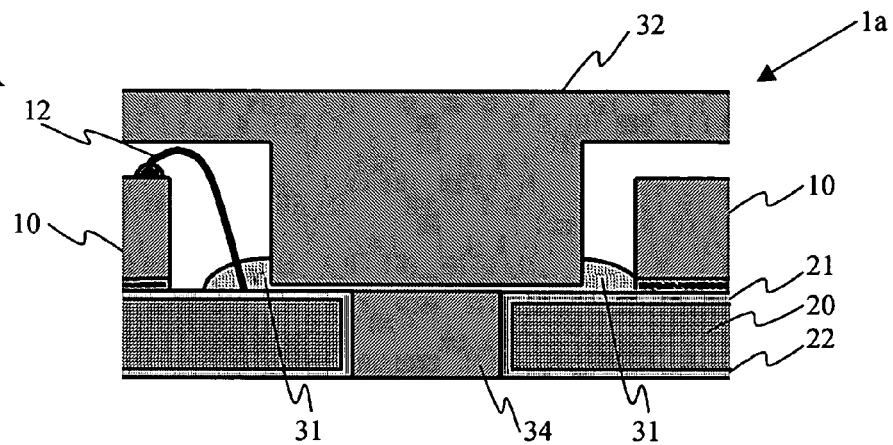
FIGS. 5A and 5B are cross-sectional views of another example of a SAW device.
Figure 5B:
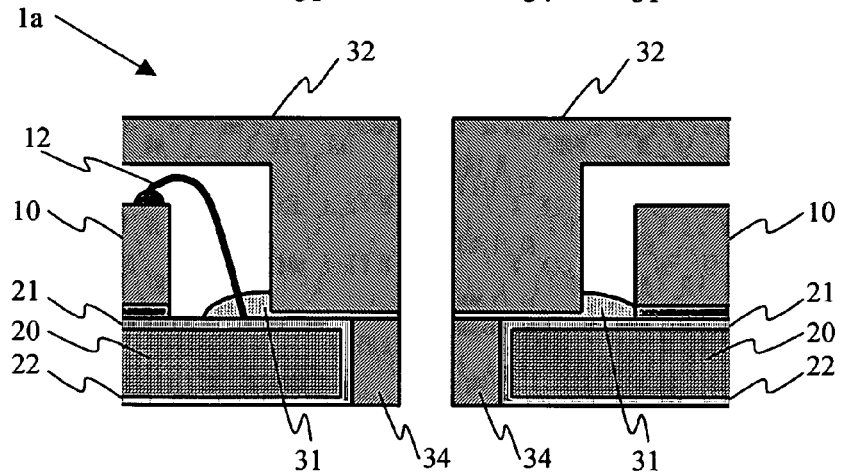

FIGS. 5A and 5B illustrate a SAW device 1a, which is another example of the SAW device 1. More specifically, FIG. 5A is a cross-sectional view of the SAW device 1a before cutting, and FIG. 5B is a cross-sectional view of the SAW device 1a after cutting by the dicing blade 41.

As is shown in FIG. 5A, a resin 34 fills the contact through hole 23. It is possible to form the resin 34 by squeegee printing or the like. In this case, the adhesive 31 adhering the resin substrate 20 and the sheet cap 32 never flows into the contact through hole 23 and is restrained to run to the reverse-side metal pattern 22 because of the resin 34. It is therefore possible to prevent the function of the reverse-side metal pattern 22 as an external terminal from being damaged.

In addition, as shown in FIG. 5B, there is no adhesive outside of the resin cap 32 that is the divided sheet cap 32, unlike the conventional SAW device. Furthermore, the end surfaces form a continuing plane. It is thus possible to provide a SAW device having a small and stabilized shape. The end surfaces correspond to the end surfaces in SUMMARY OF THE INVENTION.

Figure 6A:
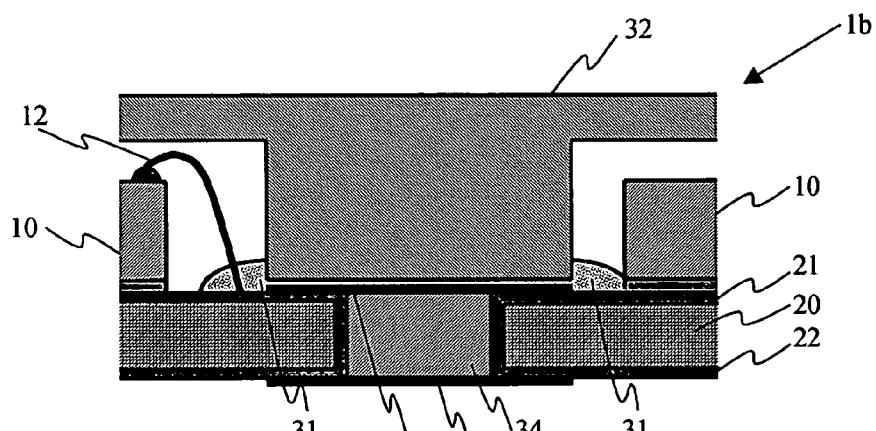
FIGS. 6A and 6B are cross-sectional views of yet another example of the SAW device.
Figure 6B:
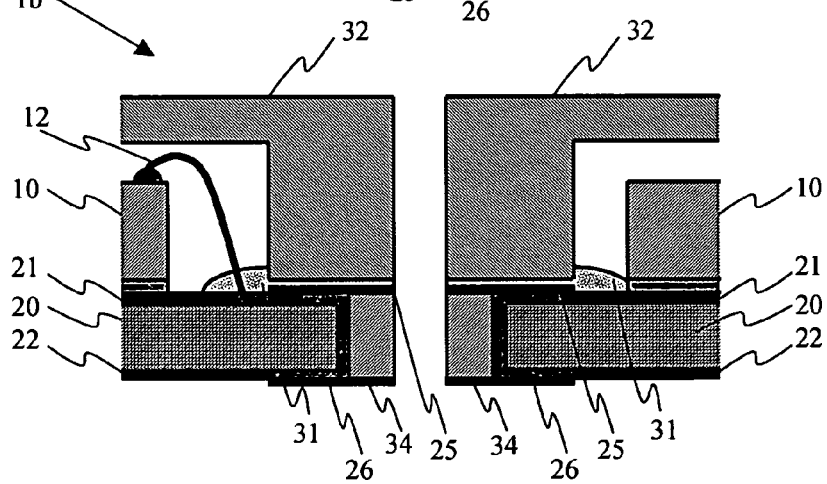

FIGS. 6A and 6B illustrate a SAW device 1b, which is yet another example of the SAW device 1. More specifically, FIG. 6A is a cross-sectional view of the SAW device 1b before cutting, and FIG. 6B is a cross-sectional view of the SAW device 1b after cutting by the dicing blade 41.

As shown in FIG. 6A, the resin 34 fills the contact through hole 23, and a metal plating 25 is further formed on the resin 34. In addition, a metal plating 26 is formed on the lower surface of the resin substrate 20 so as to cover the contact through hole 23.

In this case, the adhesive agent 31 adhering the resin substrate 20 and the sheet cap 32 never flow into the contact through hole 23. It is therefore possible to prevent the function of the reverse side metal wiring 22 as an external terminal from being damaged. In addition, the surface of the resin 34 is covered with the metal plating 25. This increases the air-tightness reliability because the moisture permeability of the resin 34 is improved by metal plating.

In addition, as shown in FIG. 6B, there is no adhesive outside of the resin cap 32, which is the divided sheet cap 32, unlike the conventional SAW device. Furthermore, the end surfaces form a continuing plane. It is thus possible to provide a SAW device having a small and stabilized shape. The end surfaces correspond to the end surfaces in SUMMARY OF THE INVENTION.

Figure 7B:
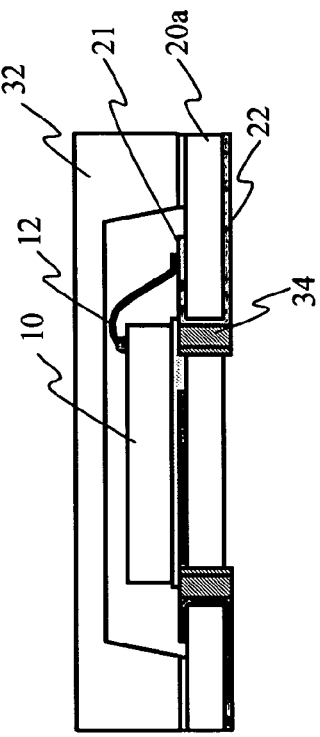
FIGS. 7A through 7C illustrate another example of a resin substrate.
Figure 7C:
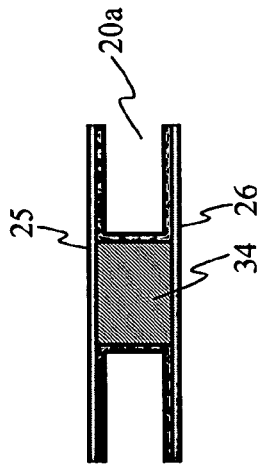
Figure 7A:
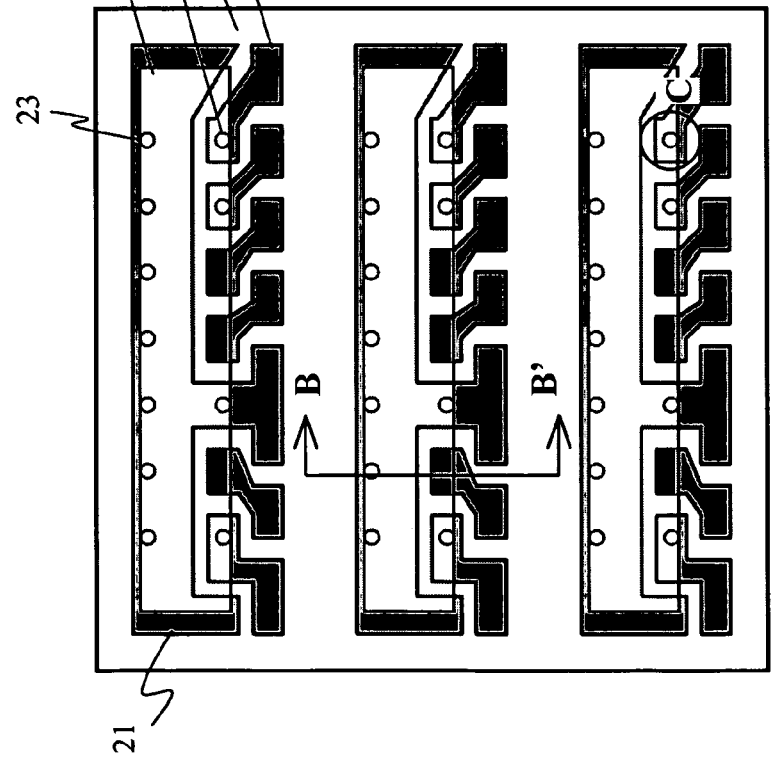

FIGS. 7A and 7B illustrate a resin substrate 20a, which is another example of the resin substrate 20. More specifically, FIG. 7A illustrates a partially permeated top view of the resin substrate 20a, FIG. 7B is a cross-sectional view of the contact through hole 23 at a part C shown in FIG. 7A, and FIG. 7C is a cross-sectional view taken along a line B-B' in FIG. 7A.

As shown in FIGS. 7A and 7C, the obverse-side metal pattern 21 is formed on the upper surface of the resin substrate 20a, and the reverse-side metal pattern 22 is formed on the lower surface of the resin substrate 20a. A bonding pad 27, to which the metal wire 12 is connected, is provided on the obverse-side metal pattern 21. The reverse-side metal pattern 22 functions as an external terminal. The SAW device element 10 is mounted on the obverse-side metal wiring 21. The obverse-side metal pattern 21 is connected to the reverse-side metal pattern 22 through the contact through hole 23. The contact through hole 23 is provided under the SAW device element 10.

In this case, there is no obverse-side metal pattern 21 in the adhesive surface between the resin substrate 20a and the sheet cap 32. The resin substrate 20a and the sheet cap 32 are connected to each other not through the obverse-side metal pattern 21. Therefore, there is no difference in level in the adhesive surface between the resin substrate 20a and the sheet cap 32. Accordingly, a void of the adhesive hardly breaks out. And it is possible to achieve the stabilized sealing by the adhesive.

Further, as shown in FIG. 7B, the resin 34 fills the contact through hole 23 at a part C shown in FIG. 7A. In addition, the metal plating 25 is formed on the upper surface of the resin substrate 20a and the metal plating 26 is formed on the lower surface of the resin substrate 20a so as to cover the resin 34. In this case, it is possible to restrain the influx of the adhesive into the contact through hole 23 and to improve the airtightness reliability of the contact through hole 23 by covering the resin 34 with a metal plating, even if the adhesive adhering the resin substrate 20a and the sheet cap 32 flows to the contact through hole 23. It is therefore possible to prevent the function of the reverse side metal pattern 22 as an external terminal from being damaged. The contact through holes 23 other than the contact through hole 23 shown in C are adapted similarly.

In addition, the position of the contact through hole 23 is not limited to the position described above, and may be at the resin substrate 20a other than the adhesive surface between the resin substrate 20a and the sheet cap 32. However, the metal plating 25 on the resin 34 is more flexible than the obverse side metal pattern 21, and the connecting reliability between the resin substrate 20a and the metal wire 12 is reduced. It is therefore necessary to arrange the contact through hole 23 apart from the bonding pad 27. It is possible, however, to improve the connecting reliability between the metal wire 12 and the resin substrate 20a without an increase of the size of the resin substrate 20a, if the contact through hole 23 is provided closer to the SAW device element 10 than to the bonding pad 27. In particular, it is preferred to provide the contact through hole 23 under the SAW device element 10 as is described in FIGS. 7A and 7B.

Figure 8:
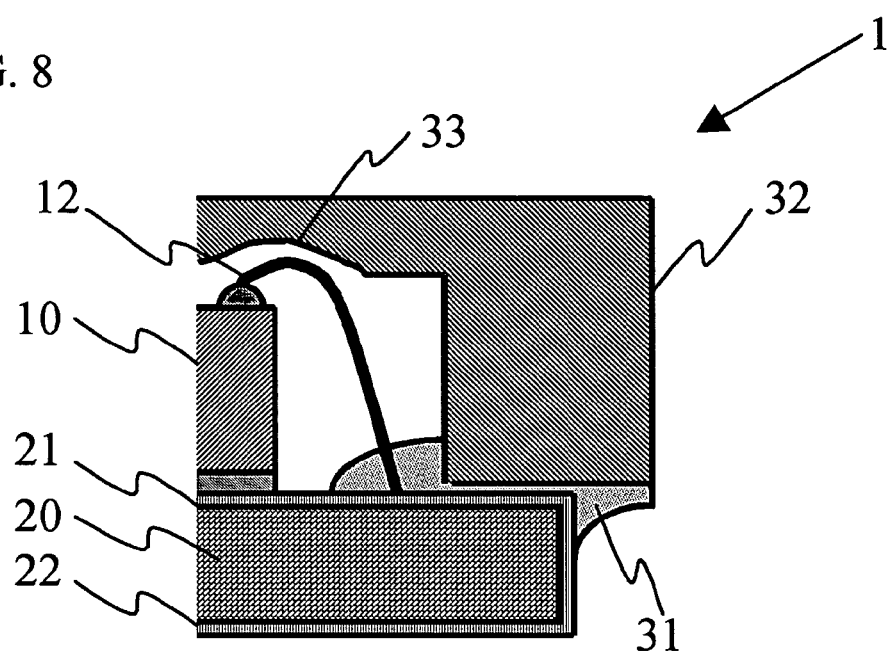
FIG. 8 is a cross-sectional view of an example of a sheet cap.

Next, a detailed description will be given of the sheet cap 32. FIG. 8 is a cross-sectional view of an example of the sheet cap 32. As is shown in FIG. 8, the metal wire 12 is connected to the obverse-side metal pattern 21 in a looping arch from the upper surface of the SAW device element 10. A concavity 33 is formed in the sheet cap 32, being not in contact with the metal wire 12 and avoiding the metal wire 12. That is, a form of the internal ceiling of the sheet cap 32 has a concavity shape avoiding the looping shape of the metal wire 12.

In this case, the metal wire 12 and the sheet cap 32 are not in touch with each other, and it is possible to restrain a change in shape of the metal wire 12. In addition, the concavity 33 has to be provided only in a required position of the sheet cap 32, and it is not necessary to reduce the thickness of the sheet cap 32 entirely. Therefore, it is possible to reduce the height of the SAW device 1 without the reduction of the intensity of the sheet cap 32.

Further, it is necessary to determine a relative position between the every concavity 33 and the every metal wire 12 with a high degree of accuracy. However, it is possible to determine the position of the sheet cap 32 by the sheet cap, and it is possible to determine the position of the resin substrate 20 and the sheet cap 32 with a high degree of accuracy by providing a positioning guide hole in the resin substrate 20 and the sheet cap 32.

Next, a description of size of the SAW device 1 will be given illustrating an example. In the SAW device 1 in FIG. 2, for example, the thickness of the resin substrate 20 is 0.2 mm, the thickness of the obverse-side metal pattern 21 and the reverse-side metal pattern 22 is 0.03 mm, the thickness of the SAW device element 10 is 0.4 mm, the looping height of the metal wire 12 at a maximum is 0.1 mm from the top surface of SAW device element, and the thickness of the ceiling of the sheet cap 32 is 0.2 mm. In this case, the thickness of the SAW device 1 is 1.01 mm, and 1.1 mm at a maximum considering every tolerance of size.

In contrast, in the SAW device 1 in FIG. 8, the thickness of the ceiling of the sheet cap 32 at the concavity 33 can be, for example, 0.1 mm. In this case, the thickness of the SAW device in FIG. 8 can be 1.0 mm at a maximum.

As is described above, it is possible to reduce the thickness of the SAW device 1 without reduction of the intensity of the sheet cap 32 by forming the concavity 33 in the sheet cap 32.

Figure 14A:
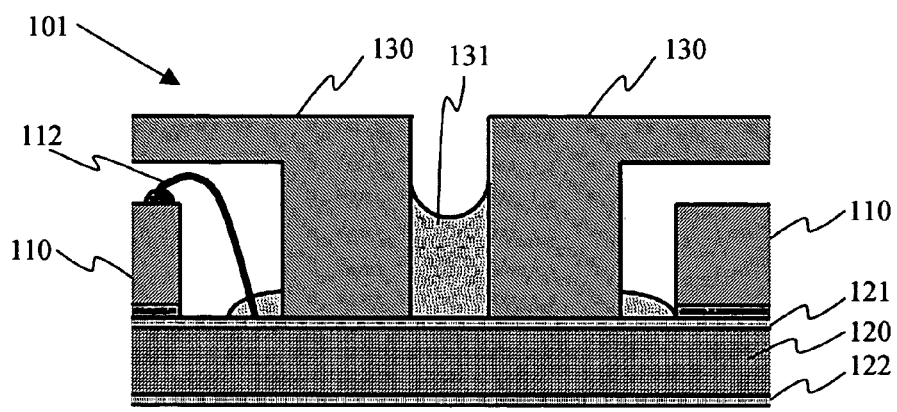
FIGS. 14A and 14B illustrate a cutting surface of a conventional SAW device.
Figure 14B:
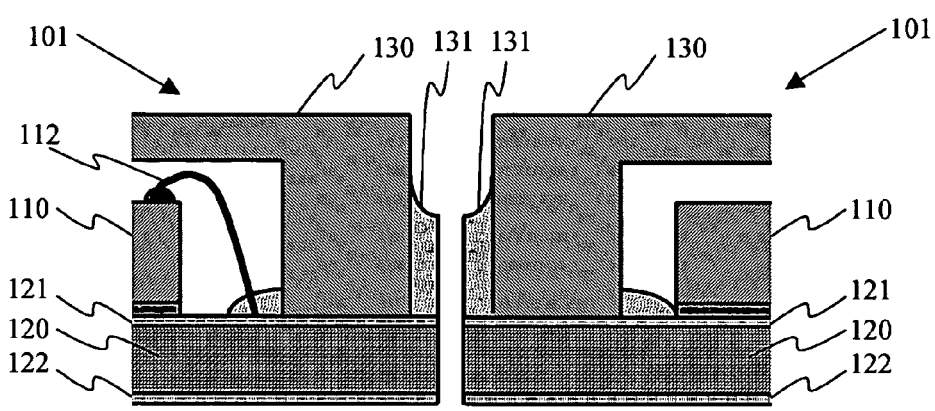

In addition, it is possible to reduce the thickness of the conventional SAW device 101 shown in FIG. 14 by forming a hollow having the concavity 33 in FIG. 8 in the resin cap 130 of the SAW device 101.

Figure 9:
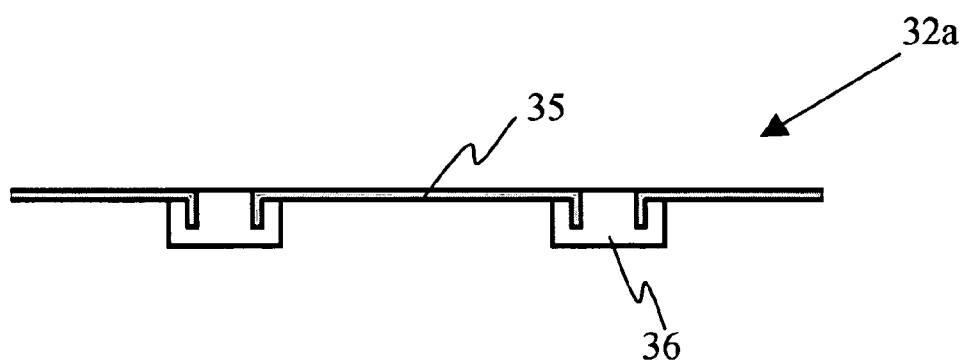
FIG. 9 is a cross-sectional view of another example of the sheet cap.

FIG. 9 is a cross-sectional view of a sheet cap 32a, which is another example of the sheet cap 32. As is shown in FIG. 9, the sheet cap 32a is formed of metal caps 35 covering the SAW device elements 10 and a sheet resin 36 to which the metal caps 35 are secured. It is possible to form the sheet cap 32a by an insert molding of the metal caps in a mold. The resin substrate 20 is adhered to the sheet cap 32a through this sheet resin 36.

The metal cap 35 has a significant intensity relative to resins, even if the thickness thereof is approximately 0.1 mm. It is therefore possible to reduce the thickness of the SAW device 1 while keeping a significant intensity of the SAW device 1 and keeping an electric insulation between the metal cap 35 and the metal wire 12, even if the concavity 33 shown in FIG. 8 is not formed.

In addition, the ceiling of the sheet cap 32a has a flat shape. And the metal wire 12 is never in touch with the metal cap 35 even if positions of the resin substrate 20 and the sheet cap 32a are not determined with a high degree of accuracy. It is therefore possible to align the resin substrate 20 and the sheet cap 32a easily.

In addition, a cross-sectional surface shown in FIG. 9 is not limited to that of the sheet cap 32, and can be adapted to the resin substrate 120 using conventional individual caps 130 in FIG. 12. However, it is necessary to determine a relative position between the cap 130 and the highest part of a metal wire with a high degree of accuracy if the cap 130 has a cross-sectional surface shown in FIG. 8 avoiding the metal wire 12. It is possible to determine positions of the caps by the sheet in a method using the sheet cap in accordance with the present invention. And it is possible to align the caps and the resin substrate 20 with a high degree of accuracy by forming a guide hole in the resin substrate 20 and the sheet cap 32.

In the present embodiment, the resin substrates 20 and 20a correspond to the first resin substrate, and the sheet caps 32 and 32a correspond to the second resin substrate.

Second Embodiment

Figure 10A:
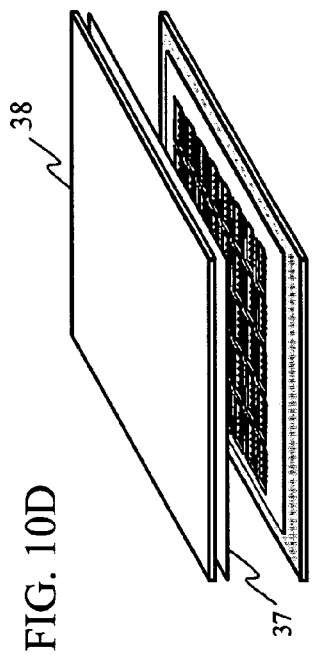
FIGS. 10A through 10F illustrate a manufacturing method of a SAW device in accordance with a second embodiment of the present invention.
Figure 10B:
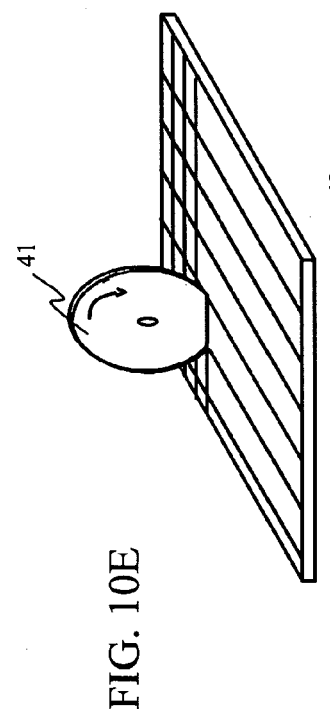

FIGS. 10A through 10F illustrate a manufacturing method of the SAW device in accordance with a second embodiment of the present invention. In FIG. 10A, the sheet shape resin frame 28 is settled on the resin substrate 20. In the sheet shape resin frame 28, holes bigger than the SAW device 1 shown in FIG. 10B are formed in an array of rows and columns at given intervals on the resin frame 28. The second embodiment in FIG. 10 is different from the first embodiment in that the resin frame 28 corresponding to a wall of the sheet cap 32 is molded on the resin substrate 20 in advance.

In the obverse-side metal pattern 21 on the resin substrate 20, there is a difference in level of approximately 25 μm between a part where the obverse-side metal pattern 21 is formed and a part where the obverse-side metal 21 is not formed in the adhesive area between the sheet cap 32 and the resin substrate 20 in accordance with the first embodiment. In the first embodiment, it is necessary to coat a significant amount of adhesive to this adhesive area so that the difference in level formed by the obverse-side metal pattern 21 is filled. In contrast, in the second embodiment the resin frame 28 is molded on the resin substrate 20 in advance. And it is possible to fill the difference in level formed by the obverse-side metal pattern 21. It is possible, as a result, to smooth out the upper surface of the resin frame 28 and it is possible to connect a resin lid 38 to the resin frame 28 using a minimum amount of adhesive.

Figure 10C:
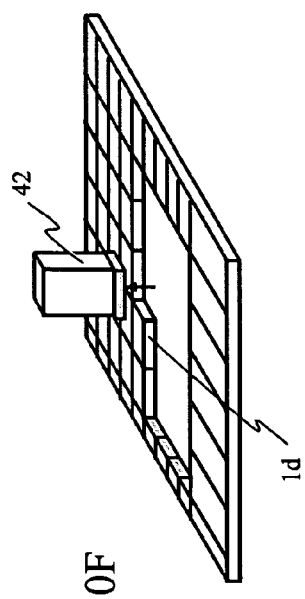

Next, as is shown in FIG. 10B, each of the SAW device elements 10 is mounted in every holes on the resin frame 28. Then, as is shown in FIG. 10C, the SAW device element 10 and the metal pattern formed on the resin substrate 20 are connected through the metal wire 12 by the bonding capillary 13.

Figure 10D:
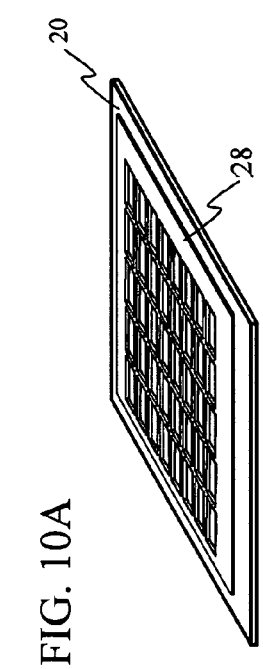
Figure 10E:
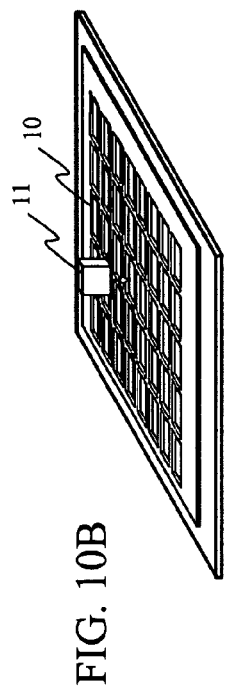
Figure 10F:
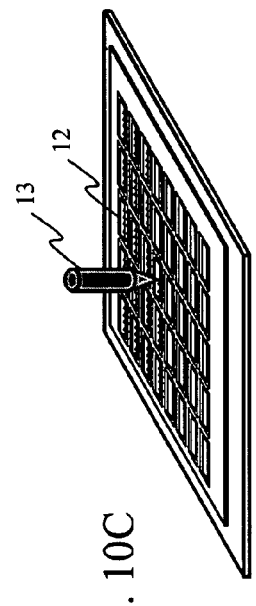

Next, as is shown in FIG. 10D, the resin lid 38 having a sheet shape is adhered on the resin frame 28 through the adhesive 37, and is sealed by pressure and heat. Then, the resin substrate 20, the resin frame 28 and the resin lid 38 are cut into devices, each of which has one SAW device element 10 by the dicing blade 41. Next, as is shown in FIG. 10F, a SAW device 1d is separated out of the resin substrate 20, the resin frame 28 and the resin lid 38 by a transfer tool 42. And the SAW device 1d is completed.

In this case, each of the SAW device elements 10 can be covered when the resin substrate 20 prepared, the resin frame 28 and the resin lid 38 are only overlapped. And a step of adhering each resin cap to each resin substrate of SAW device individually is omitted. Therefore, the manufacturing process of the SAW device can be simplified. In addition, an adhesive 37 is coated simultaneously between the resin frame 28 and the resin lid 38. Therefore, the movement of the resin caps does not occur.

Figure 11A:
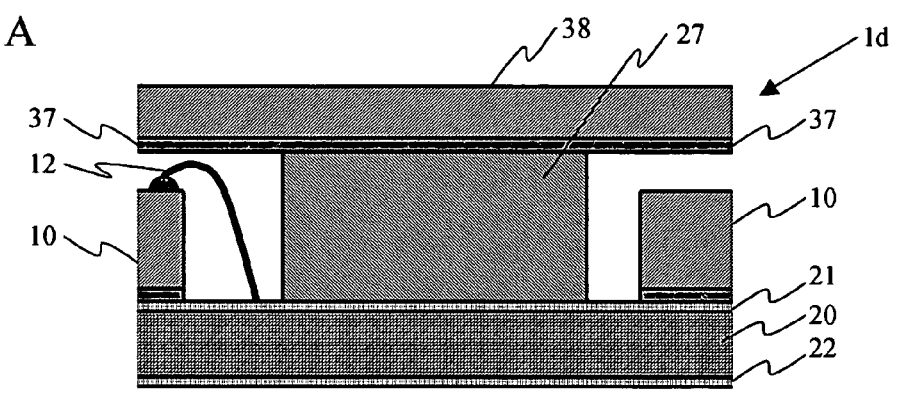
FIGS. 11A and 11B are cross-sectional views of a SAW device shown in FIG. 10.
Figure 11B:
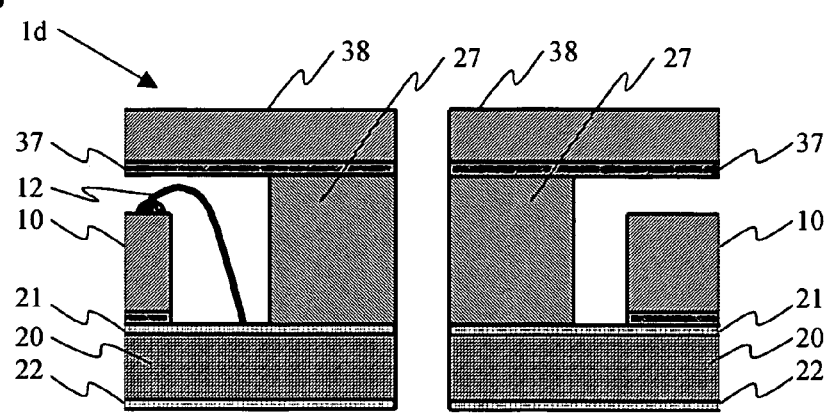
Figure 13A:
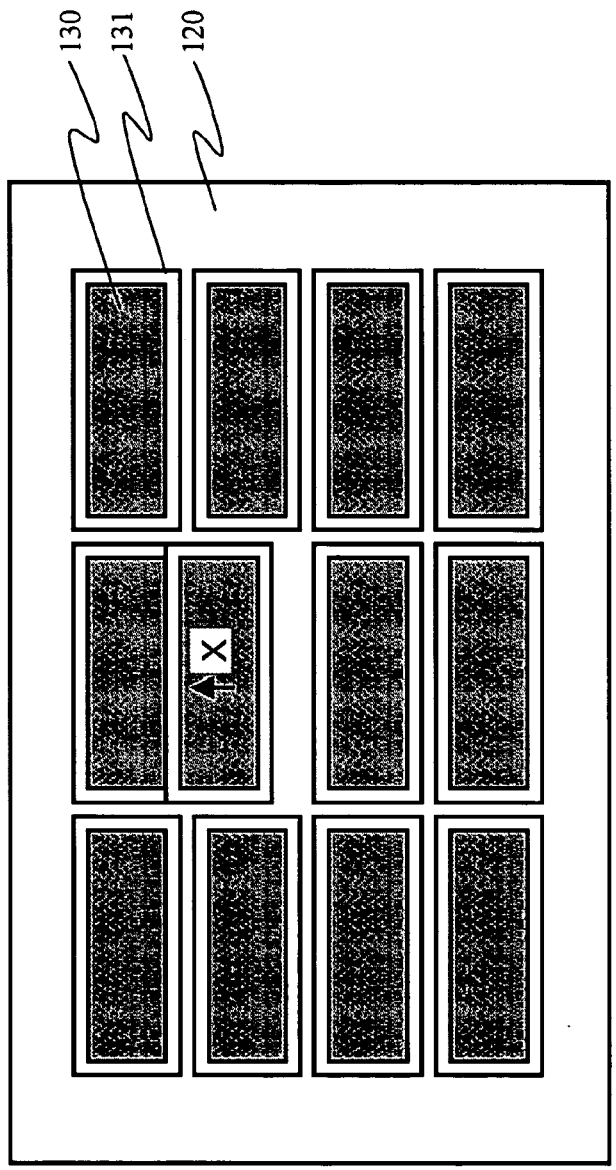
FIGS. 13A and 13B illustrate a displacement of a resin cap caused by a surface tension of an adhesive agent.
Figure 13B:
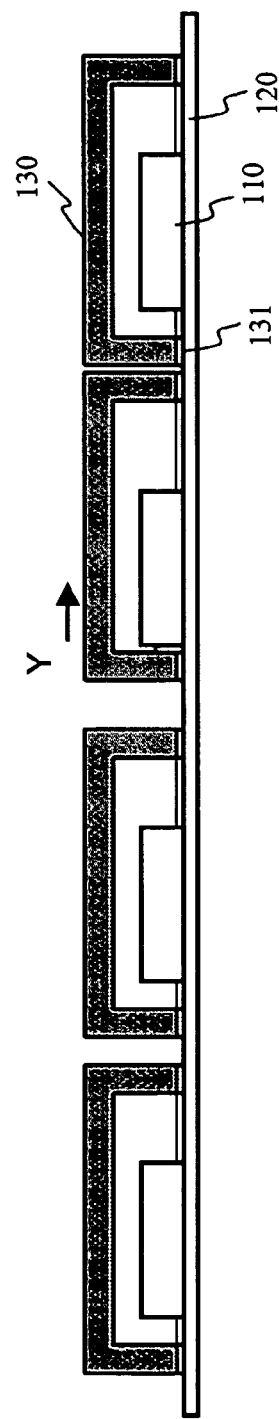

FIGS. 11A and 11B illustrate a cross-sectional views of the SAW device 1d shown in FIG. 10. More specifically, FIG. 11A is a cross-sectional view of the SAW device 1d before cutting. FIG. 11B is a cross-sectional view of the SAW device 1d after cutting by the dicing blade 41.

As is shown in FIG. 11B, the resin frame 28 and the resin lid 38 are cut simultaneously by the dicing blade 41. And one end surface of the resin substrate 20 and one end surface of the resin lid 38 are on a same plane. As is described above, there is no adhesive and no part of the resin substrate outside of the resin rid 38, unlike the conventional SAW device. And it is possible to provide a SAW device having a small and stabilized external shape. The end surface of the resin substrate 20 and the end surface of the resin lid 38 correspond to the end surfaces in SUMMARY OF THE INVENTION.

While the preferred embodiment of the prevent invention have been illustrated in detail, the invention is not limited to the specific embodiments above. In addition, it will be appreciated that the invention is susceptible of modification, variation and change without departing from the proper and fair meaning of the accompanying claims. This invention can be applied to electronics devices having an element other than the SAW device element.

The present invention is based on Japanese Patent Application No. 2004-251103 filed on Aug. 30, 2004, the entire disclosure of which is hereby incorporated by reference.

What is claimed is:

1. A surface acoustic wave device comprising:
   a surface acoustic wave (SAW) device element; and
   a package housing the SAW device element,
   wherein:
   the package includes a resin substrate having metal patterns formed on both surfaces thereof, and a resin cap;
   the SAW device element is mounted on one of the metal patterns of the resin substrate;
   the resin cap having a hollow integrally formed so as to avoid the SAW device element is adhered to the resin substrate to cover the SAW device element; and
   end surfaces of the resin substrate are flush with corresponding end surfaces of the resin cap.

2. The surface acoustic wave device as claimed 1, wherein:
   the metal patterns on the opposing surfaces of the resin substrate are connected to each other through one or more contact through holes formed on at least one end surface of the resin substrate; and
   the one or more contact through holes include a metallized inner surface of the through hole.

3. The surface acoustic wave device as claimed 2, further comprising a lid of resin film provided at an end of the one or more contact through holes located on a side of the resin substrate on which side the SAW device element is provided.

4. The surface acoustic wave device as claimed 2, wherein:
   the contact through hole is filled with a resin; and
   the resin has a cut surface flush with an end surface of the resin substrate.

5. The surface acoustic wave device as claimed 4, wherein metal plating lids are formed on both surfaces of the resin.

6. The surface acoustic wave device as claimed 1, wherein:
   the metal patterns on the opposing surfaces of the resin substrate are connected to each other through one or more contact through holes; and
   the one or more contact through holes passing through the resin substrate are formed on an area except a portion where the resin cap is connected to the resin substrate.

7. The surface acoustic wave device as claimed 6, wherein the one or more contact through holes are provided under the SAW device element.

8. The surface acoustic wave device as claimed 1, wherein the resin cap is adhered to a portion of the resin substrate except a portion where the metal patterns are formed.

9. The surface acoustic wave device as claimed 1, further comprising a metal wire connecting the SAW device element to one of the metal patterns of the resin substrate,
   wherein a cross-sectional shape of a ceiling in the resin cap is a divot shape avoiding a looping shape of the metal wire.

10. The surface acoustic wave device as claimed 1, further comprising a metal wire connecting the SAW device element to one of the metal patterns of the resin substrate,
    wherein a portion of the resin cap covering the surface acoustic wave device element is formed of metal.

* * * * *